(12) United States Patent
Adan

(10) Patent No.: US 6,798,011 B2
(45) Date of Patent: Sep. 28, 2004

(54) MULTI-TERMINAL MOS VARACTOR

(75) Inventor: Alberto Oscar Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/345,404

(22) Filed: Jan. 16, 2003

(65) Prior Publication Data

US 2003/0136992 A1 Jul. 24, 2003

(30) Foreign Application Priority Data

Jan. 21, 2002 (JP) .................................. 2002-011757

(51) Int. Cl.$^7$ ............................................... H01L 29/94
(52) U.S. Cl. ................................ 257/312; 257/296
(58) Field of Search ............................ 257/296, 300, 257/312, 313; 438/238, 239, 386, 399

(56) References Cited

U.S. PATENT DOCUMENTS 6,621,128 B2 * 9/2003 Lee et al.

FOREIGN PATENT DOCUMENTS

JP 62-179162 A 8/1987

OTHER PUBLICATIONS

Abidi ("Power–conscious design of wireless circuits and systems," Proceedings of the IEEE, Oct. 2000, vol. 8, Issue 10, p 1528–1545).*

Abidi et al, "Power–conscious design of wireless circuits and systems", Proceedings of the IEEE, vol. 88, No. 10, Oct. 2000, pp. 1528–1545.

* cited by examiner

Primary Examiner—Nathan J. Flynn
Assistant Examiner—Kevin Quinto
(74) Attorney, Agent, or Firm—Nixon & Vanderhye P.C.

(57) ABSTRACT

In a multi-terminal MOS varactor, a floating electrode 8 of a MOS capacitor (Cf) 5 is connected to one of two terminals of each of a plurality of capacitors (C1–Cn) 6-1 through 6-n. To the other terminals (Vg1–Vgn) 9-1 through 9-n of the respective capacitors (C1–Cn) 6-1 through 6-n, control voltages Vg1–Vgn are applied, and a terminal (Vn) 11 of the MOS capacitor (Cf) 5, the terminal being on the side of a well, receives a control voltage. In the multi-terminal MOS varactor with the arrangement above, it is possible to progressively change the valid electrostatic capacity C of the other terminal (Vgj) 9-j of an arbitrary capacitor (Cj) 6-j, by changing the control voltage. Since electrostatic capacity can be progressively changed in this MOS varactor, adopting this MOS varactor to an oscillator enables to control a frequency and sensitivity of the oscillator.

13 Claims, 13 Drawing Sheets

MULTI-TERMINAL MOS VARACTOR

FIELD OF THE INVENTION

The present invention relates to a MOS varactor which can be adopted to ICs, especially to high-frequency ICs, and controls electrostatic capacity using voltages applied from a plurality of terminals.

BACKGROUND OF THE INVENTION

Voltage-controlled variable capacitors are capacitors which can control electrostatic capacity in accordance with an applied voltage, and also known as varactors. Varactors are manufactured by a CMOS process utilizing (1) voltage dependency of P-N junction diodes or (2) voltage dependency of MOS capacitors. Varactors utilizing (2) are specifically termed MOS varactors.

Varactors are widely used for control circuits and oscillators. For instance, radio frequency (RF) oscillators use varactors for adjusting an oscillatory frequency to a particular value. In the case of LC (inductor capacitor) oscillators which are kinds of the RF oscilators, an oscillatory frequency is typically determined by the equation below.

$$\omega_O = 1/\sqrt{\sqrt{L \times C}}$$

Thus, in an LC oscillator using a varactor, it is possible to control a frequency by changing a value C indicating electrostatic capacity. Here, the varactor is preferably arranged so as to be capable of controlling electrostatic capacity in a wide range. Moreover, it is preferable that the generation of a capacity component which influence on the operation of the oscillator is restrained. Adopting the varactor with the foregoing characteristics enables to control a frequency in a wide range by a control circuit and an oscillator.

Now, a conventional embodiment using a varactor is discussed below. For instance, a voltage controlled oscillator (VCO) adopts a discrete variable MOS varactor 121 with an arrangement illustrated in FIG. 12(a) FIG. 12(a) is a schematic view, illustrating a circuit diagram of a voltage controlled oscillator (VCO) using a discrete variable MOS varactor 121 for controlling an oscillatory frequency, and FIG. 12(b) is a schematic view, illustrating a circuit diagram of the discrete variable MOS varactor 121 of the VCO. This embodiment is disclosed in A. A. Abidi, G. J. Pottie, and W. J. Kaiser, "Power-Conscious Design Of Wireless Circuits And Systems", Proceedings of the IEEE, vol. 88, (No. 10), pp. 1528–1545, published in October 2000, and is a typical embodiment of a voltage controlled oscillator (VCO) using a banked MOS varactor.

According this arrangement, in the discrete variable MOS varactor 121, a MOS capacitor 122 as illustrated in FIG. 12(c), which is commonly connected to capacitors C, 2C, and 4C, receives a tuning voltage. In this arrangement, valid electrostatic capacity can be varied by changing this tuning voltage (bias voltage of an N-well). Further, the discrete variable MOS varactor 121 includes a plurality of capacitor banks and can change the frequency of the VCO in a discrete manner by switching on/off the transistor using control signals b0, b1, and b2.

FIG. 13 is a circuit diagram, illustrating a semiconductor variable capacitive element disclosed by Japanese Laid-Open Patent Application No. 62-179162/1987 (Tokukaisho 62-179162; published on Aug. 6, 1987). In this invention, a bias terminal 103 for applying a bias voltage to a capacitive electrode 112 from the outside is provided and this enables to control electrostatic capacity from the viewpoint of a capacitive terminal 105 so that it is possible to change the value of the electrostatic capacity by the bias voltage. Moreover, a voltage of a connected external circuit is cut off by bias-cut capacity 104 so that a low and constant bias voltage can be applied to the capacitive electrode 112. With this arrangement, it is possible to prevent an unnecessary bias voltage from being applied to the capacitive electrode 112 so as to realize a reliable semiconductor variable capacitive element whose value of the electrostatic capacity does not change over time.

Incidentally, by connecting a capacitive terminal 105 in FIG. 13 as an output terminal LO in FIG. 12(a), it is possible to transform the semiconductor variable capacitive element in FIG. 13 into the discrete variable MOS varactor 121 of the VCO in FIG. 12(a).

It is noted that conventional MOS varactors can be operated by a typical process of CMOS ICs without adding a supplementary step to the process, and have such a characteristic that the adjustable range of electrostatic capacity is wider than that of diodes (P-N junction diodes).

However, since the MOS varactors have two terminals: (1) a gate and (2) a silicon well, it is difficult to adjust the fluctuations of electrical parameters, occurring in the process.

Moreover, since the circuit in FIG. 12(a) adopts the plurality of capacitor banks as in the foregoing description, the frequency of the VCO is changed by the plurality of capacitor banks in a discrete manner so that it is not possible to change the frequency of the VCO in a progressive manner. Further, because of a switching transistor controlled by control signals b0, b1, and b2, a high series resistance is added and hence the performance index (Q-factor) of the VCO decreases. To compensate this decrease of the Q-factor, a very large switching transistor is needed and this causes the increase of the size of the whole arrangement.

In the meantime, the conventional example (Japanese Laid-Open Patent Application No. 62-179162/1987) in FIG. 13 includes a bias terminal 103 for bias control, and is arranged in such a manner that a bias point moves along a C-Vc curve when the bias point is adjusted or selected. However, when the semiconductor variable capacitive element in FIG. 13 is used for the VCO in a PLL (Phase Locked Loop) which is a closed loop, a sensitivity $\Delta C/\Delta Vc$, which influences on the operation of the VCO, is changed.

As described above, the conventional method using P-N junction diodes and MOS varactors has such a drawback that the controllable range of electrostatic capacity is limited and the sensitivity $\Delta C/\Delta Vc$, which is the ratio between an electrostatic capacity and a voltage, cannot be controlled.

SUMMARY OF THE INVENTION

The objective of the present invention is to provide a MOS varactor in which electrostatic capacity can be progressively changed and which enables to control a frequency and sensitivity when adopted to an oscillator.

To achieve the foregoing objective, the multi-terminal MOS varactor in accordance with the present invention comprises: a MOS capacitor including an impurity area formed on a well, a control terminal connected to the impurity area, and a floating electrode facing the well; and a plurality of capacitors each having two terminals, one terminal being connected to the floating electrode, and the other terminal being capable of receiving a control voltage.

According to this arrangement, the multi-terminal MOS varactor is arranged in such a manner that the floating electrode of the MOS capacitor is connected to one of two terminals of each of the plurality of capacitors, and the other terminals of the plurality of capacitors can receive control voltages. Thus, when the control voltages are applied to the other terminals of the plurality of capacitors and the control voltage is applied to the control terminal, it becomes possible to progressively change the electrostatic capacity, and hence the fluctuations generated on the occasion of fabricating can be compensated. Moreover, the arrangement makes it possible to fabricate a multi-terminal MOS varactor using a typical CMOS process, without adding a supplementary step.

For a fuller understanding of the nature and advantages of the invention, reference should be made to the ensuing detailed description taken in conjunction with the accompanying drawings.

DESCRIPTION OF THE EMBODIMENTS

Figure 1:
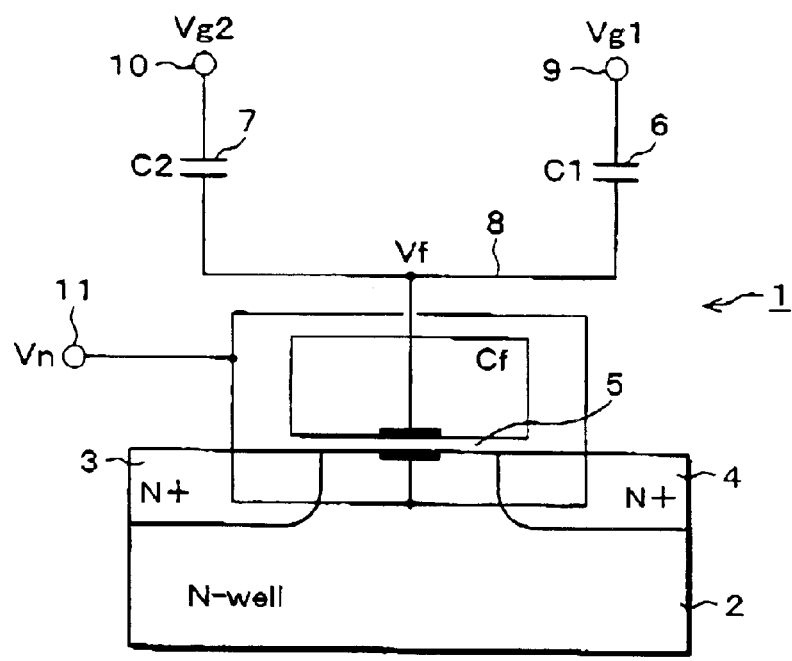
FIG. 1 is a schematic block diagram, illustrating a multi-terminal MOS varactor.

FIG. 1 is a schematic block diagram, illustrating a multi-terminal MOS varactor. The figure shows a 3-terminal MOS varactor as a basic arrangement of the multi-terminal MOS varactor. In short, the multi-terminal MOS varactor in accordance with the present invention is arranged in such a manner that control terminals are added to a MOS varactor. That is to say, a multi-terminal MOS varactor 1 is provided with: a MOS capacitor (Cf) 5; a capacitor (C1) 6; a capacitor (C2) 7; a control terminal (Vg1) 9 and a control terminal (Vg2) 10; and a control terminal (Vn) 11.

The MOS capacitor (Cf) 5 is provided between an N-well 2 and a gate, and the gate, which is one of two terminals, is provided so as to face the N-well 2 and is a floating electrode (Vf) 8. The other terminal of the MOS capacitor (Cf) 5 is connected to the control terminal (Vn) 11 via N+ areas 3 and 4 which are impurity areas formed on the N-well 2.

One of two terminals of each of the capacitor (C1) 6 and the capacitor (C2) 7 is connected to the floating electrode (Vf) 8. The other terminal of the capacitor (C1) 6 is connected to the control terminal (Vg1) 9, and the other terminal of the capacitor (C2) 7 is connected to the control terminal (Vg2) 10.

It is preferable that the capacitor (C1) 6 and the capacitor (C2) 7 are MOS capacitors such as a double polysilicon capacitor (hereinafter, will be referred to as DPC) and a metal insulator metal (hereinafter, will be referred to as MIM) capacitor.

The multi-terminal varactor in accordance with the present embodiment can be manufactured by a semiconductor process. Moreover, the multi-terminal varactor can be adopted not only to a high-frequency circuit which tolerates a frequency up to 2 GHz but also to conventional circuits. Further, in the multi-terminal varactor, a voltage is controlled so that electrostatic capacity is adjusted, in order to compensate the fluctuations of a parameter in the process and progressively change the value of the electrostatic capacity of a circuit adopted to the VCO in a wide range.

In the multi-terminal MOS varactor 1, as in the foregoing description, one of two terminals of each of a plurality of capacitors is connected to the floating electrode 8 which is a floating node so that capacitive coupling is carried out. Valid electrostatic capacity of a control terminal to which a control voltage of an arbitrary capacitor depends on a voltage applied to a control terminal of another capacitor used for adjusting and controlling electrostatic capacity. The electrostatic capacity can be controlled in a progressive manner.

In the arrangement of FIG. 1, the MOS capacitor (Cf) 5 is arranged in such a manner that its electrostatic capacity changes in accordance with a gate voltage (voltage of the floating electrode (Vf) 8) Vf. In other words, the MOS capacitor (Cf) 5, whose electrostatic capacity is determined by the potential difference between the gate and the well, is a MOS varactor (variable capacitor), and the valid electric capacitor is represented by the following equation:

$$C = \frac{C_1 \times (C_2 + C_f)}{C_1 + C_2 + C_f} \text{ with } C_f = f(Vg1, Vg2, Vn)$$

In the equation above, the electrostatic capacity of the MOS capacitor (Cf) 5 is Cf, the electrostatic capacity of the capacitor (C1) 6 is C1, the electrostatic capacity of the capacitor (C2) 7 is C2, a voltage applied to the control terminal (Vg1) 9 is Vg1, a voltage applied to the control terminal (Vg2) 10 is Vg2, and a voltage applied to the control terminal (Vn) 11 is Vn.

Figure 2:
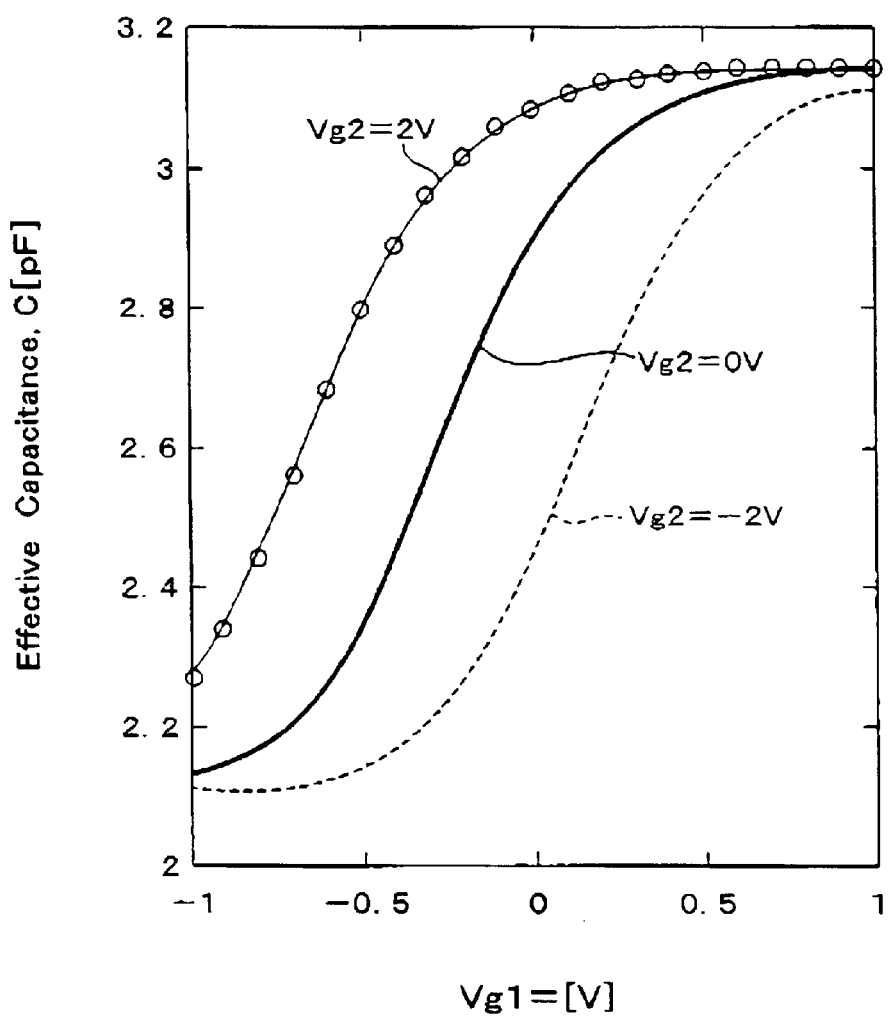
FIG. 2 is a view regarding characteristics, illustrating the relationship between a control voltage Vg1 and a valid electrostatic capacity C of the multi-terminal MOS varactor of FIG. 1.

FIG. 2 illustrates the relationship between a control voltage Vg1 and a valid electrostatic capacity C of the control terminal (Vg1) 9, using the voltage Vg2, which is applied to the terminal (Vg2) in the multi-terminal MOS varactor 1 shown in FIG. 1, as a parameter. As illustrated in the figure, as the control voltage Vg1 increases, the valid electrostatic capacity C increases. When the value of the control voltage Vg2 is varied, a C-V curve moves in a lateral direction (towards the Vg1). The valid electrostatic capacity C to the limit is represented as:

$$C \cong C_2 + C_f \text{ for } C1 >> (C_2 + C_f)$$

$$C \cong C_2 + C_{min}$$

In this equation, $C_{min}$ indicates the minimum value of the electrostatic capacity Cf when the MOS capacitor (Cf) 5 is in depletion mode.

In this manner, the multi-terminal MOS varactor 1 is arranged in such a manner that the voltages Vg1, Vg2, and Vn, which are applied to the respective terminals, are independently adjusted so that it is possible to adjust the value of electrostatic capacity and a point on the C-V curve, i.e. sensitivity $\Delta C/\Delta Vc$.

Moreover, the voltage Vf at the floating electrode 8 (floating node) of the MOS capacitor (Cf) 5 is represented as:

$$Vf = \frac{C_1 \cdot V_{g1} + C_2 \cdot V_{g2} + C_f \cdot V_n}{C_1 + C_2 + C_f}$$

The electrostatic capacity Cf of the MOS capacitor (Cf) is a function of a difference between the voltages Vf and Vn, and hence the equation above is changed into the following equation:

$$(V_f - V_n) = \frac{C_1 \cdot (V_{g1} - V_n) + C_2 \cdot (V_{g2} - V_n)}{C_1 + C_2 + C_f}$$

Figure 3:
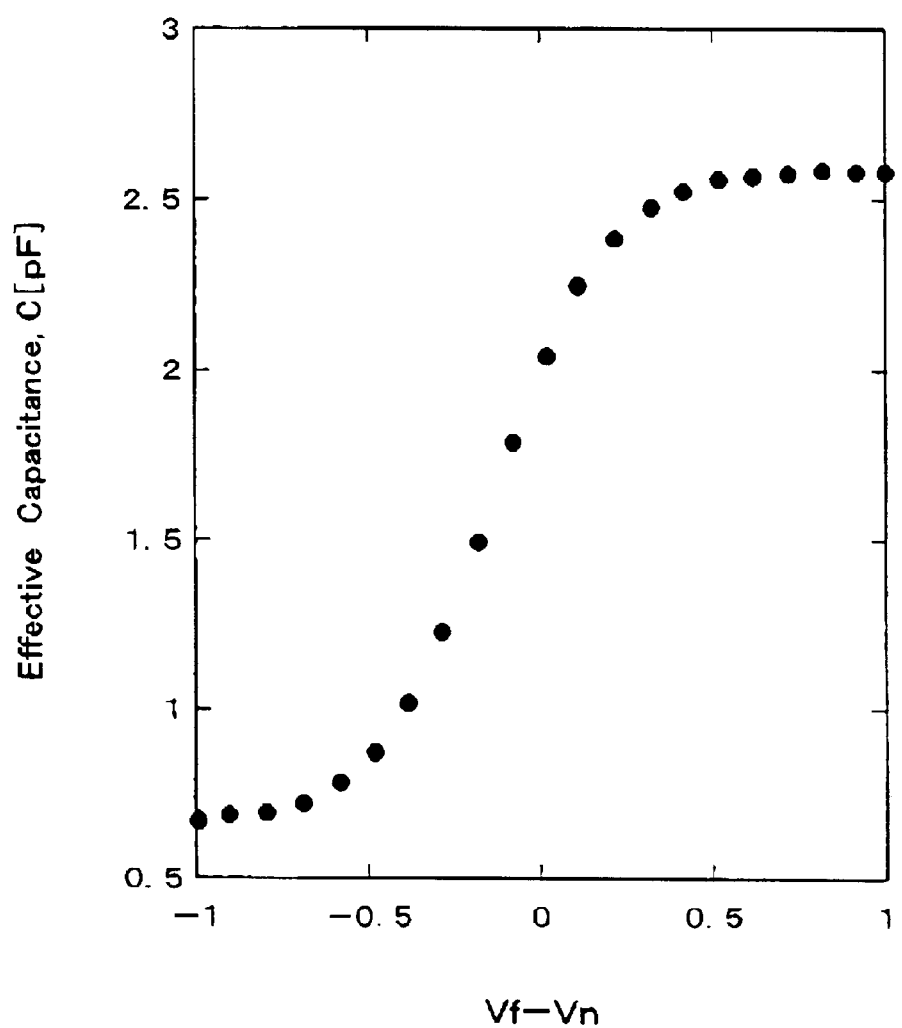
FIG. 3 illustrates a measured curve regarding a C-V characteristic of the multi-terminal MOS varactor of FIG. 1.

FIG. 3 illustrates a measured curve regarding a C-V characteristic of the MOS varactor used in the N-well 2, which is illustrated as the MOS capacitor (Cf) 5 in FIG. 1. As FIG. 3 shows, as the value of (Vf−Vn) increases, the valid electric capacitance C progressively increases.

Figure 4:
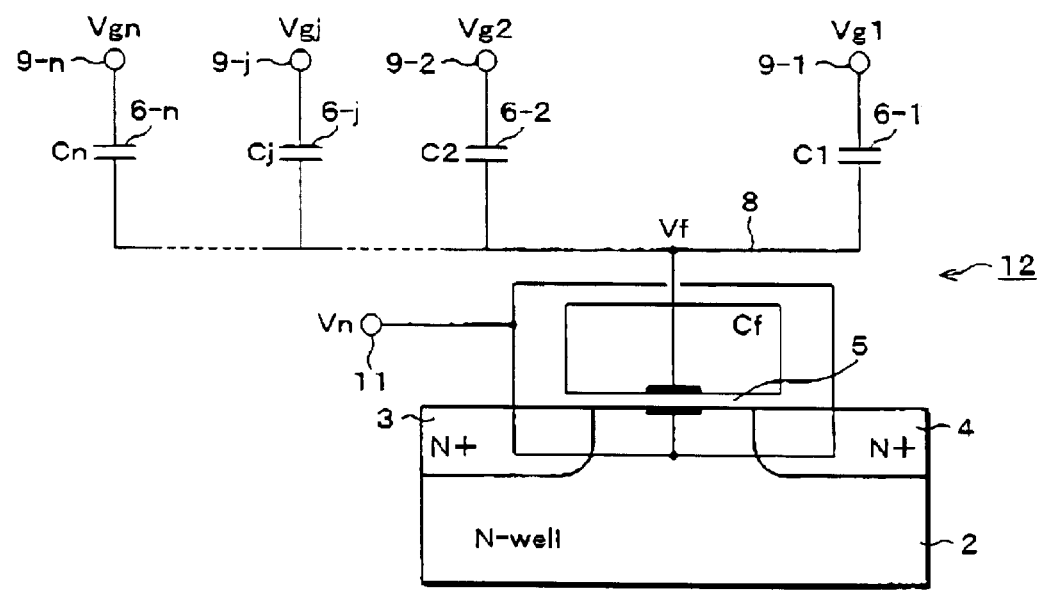
FIG. 4 is a block diagram, illustrating a multi-terminal MOS varactor with a plurality of capacitors.

On the occasion of increasing the valid electrostatic capacity C of the multi-terminal MOS varactor 1 in FIG. 1, the following arrangement can be adopted. FIG. 4 is a block diagram of a multi-terminal MOS varactor 12 having a plurality of capacitors. By the way, members having the same functions as those described in FIG. 1 are given the same numbers, so that the descriptions are omitted.

As in FIG. 4, the multi-terminal MOS varactor 12 is arranged in such a manner that a floating electrode 8 of a MOS capacitor 5 is connected to one of two terminals of each of n capacitors 6-1 through 6-n. The other terminals of the respective capacitors (C1) 6-1 through (Cn) 6-n are connected to respective control terminals (Vg1) 9-1 through (Vgn) 9-n. Further, N+ areas 3 and 4 which are impurity areas of the MOS capacitor 5 are connected to a control terminal (Vn) 11 which is a first terminal.

In this case, valid electrostatic capacity of a control terminal (Vgj) 9-j of j-th capacitor is:

$$C = \frac{C_j \times \left[\sum_{k=1, k=j}^{N} C_k + C_M(Vf)\right]}{\left[\sum_{k=1}^{N} C_k + C_M(Vf)\right]}$$

In the equation, CM(Vf) indicates the electrostatic capacity of the MOS capacitor (Cf) 5 to which the voltage Vf of the floating electrode is applied. The voltage Vf of the floating electrode is determined by control voltages supplied from the respective control terminals (Vg1) 9-1 through (Vgn) 9-n and electrostatic capacities of N+1 capacitors (n capacitors (C1) 6-1 through (Cn) 6-n and a capacitor (Cf) 5), the electrostatic capacities being in accordance with a control voltage supplied from an N+1 terminal of a control terminal (Vn) 11.

Figure 5:
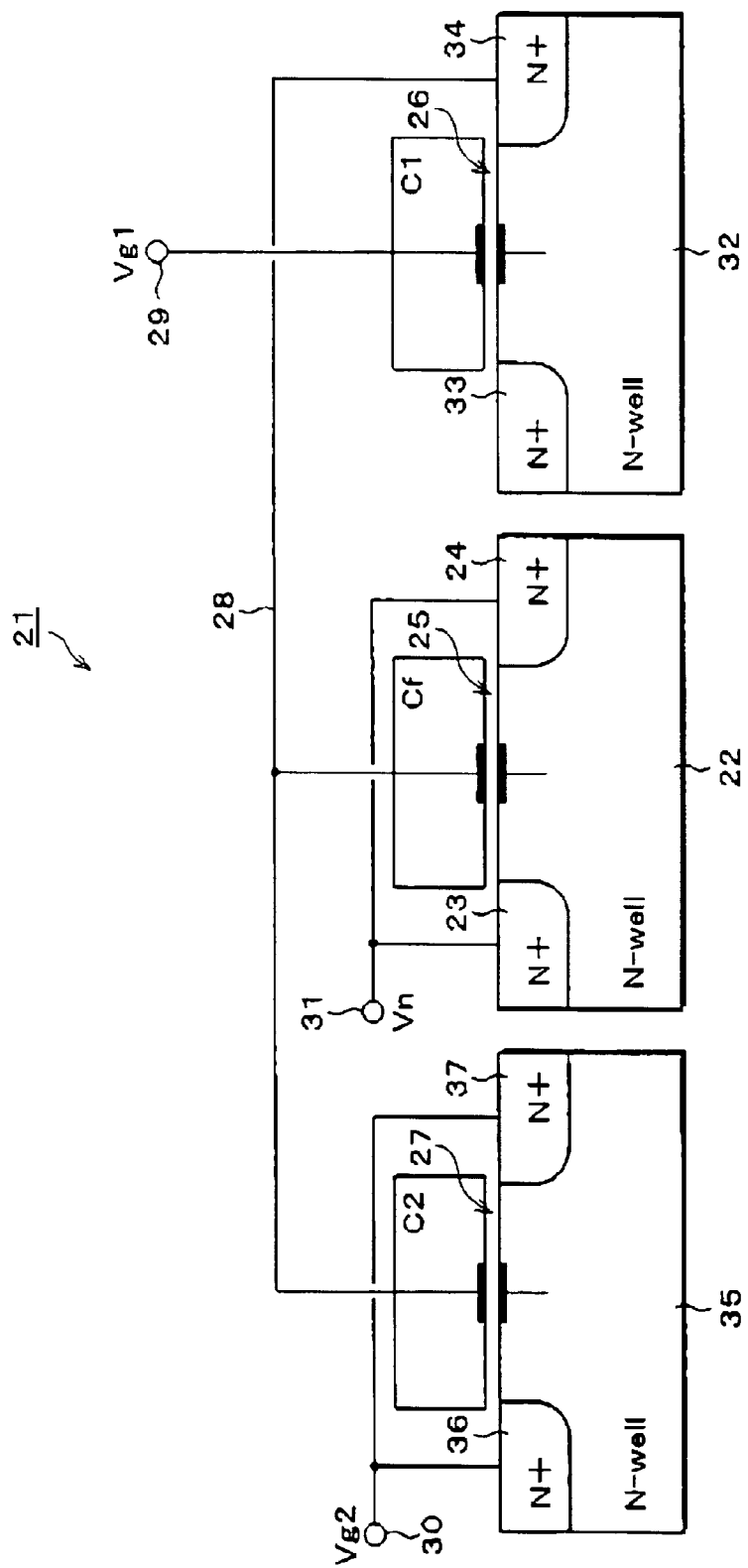
FIG. 5 is a schematic block diagram, illustrating a multi-terminal MOS varactor fabricated by a single polysilicon CMOS process.

Next, an arrangement of a multi-terminal MOS varactor fabricated by a single polysilicon CMOS process is described. FIG. 5 is a block diagram of the multi-terminal MOS varactor fabricated by the single polysilicon CMOS process. A multi-terminal MOS varactor 21 includes: a MOS capacitor (Cf) 25; a capacitor (C1) 26; a capacitor (C2) 27; a control terminal (Vg1) 29; a control terminal (Vg2) 30; and a control terminal (Vn) 31.

The MOS capacitor (Cf) 25 is provided between an N-well 22 and a gate, and the gate, which is connected to one of two terminals of the MOS capacitor (Cf) 25, is a floating electrode (Vf) 28. The other terminal of the MOS capacitor (Cf) 25 is connected to a control terminal (Vn) 31 via N+ areas 23 and 24 which are impurity areas formed on the N-well 22.

The capacitor (C1) 26 is provided between an N-well 32 and a gate, and the gate, which is connected to one of two terminals of the capacitor (C1) 26, is connected to the control terminal (Vg1) 29. The other terminal of the capacitor (C1) 26 is connected to the floating electrode (Vf) 28 via N+ areas 33 and 34 which are impurity areas formed on the N-well 32.

The capacitor (C2) 27 is provided between an N-well 35 and a gate, and the gate, which is connected to one of two terminals of the capacitor (C2) 27, is connected to the floating electrode (Vf) 28. The other terminal of the capacitor (C2) 27 is connected to the control terminal (Vg2) 30 via N+ areas 36 and 37 which are impurity areas formed on the N-well 35.

In the multi-terminal MOS varactor 21 as illustrated in FIG. 5, laminated MOS capacitors are formed on electrically isolated N-wells on a single silicon substrate, through the single polysilicon CMOS process. That is to say, as the capacitors (C1) 6 and (C2) 7 of the multi-terminal varactor 1 in FIG. 1, the capacitors (C1) 26 and (C2) 27 formed on the N-wells are used. A control voltage Vn is applied to the N-well 22 and a control voltage Vg2 is applied to the N-well 35. In the present arrangement, the control voltage Vn and the control voltage Vg2 must be arranged so as to cause the N-wells to be always positive with respect to a P substrate (not illustrated).

Figure 6:
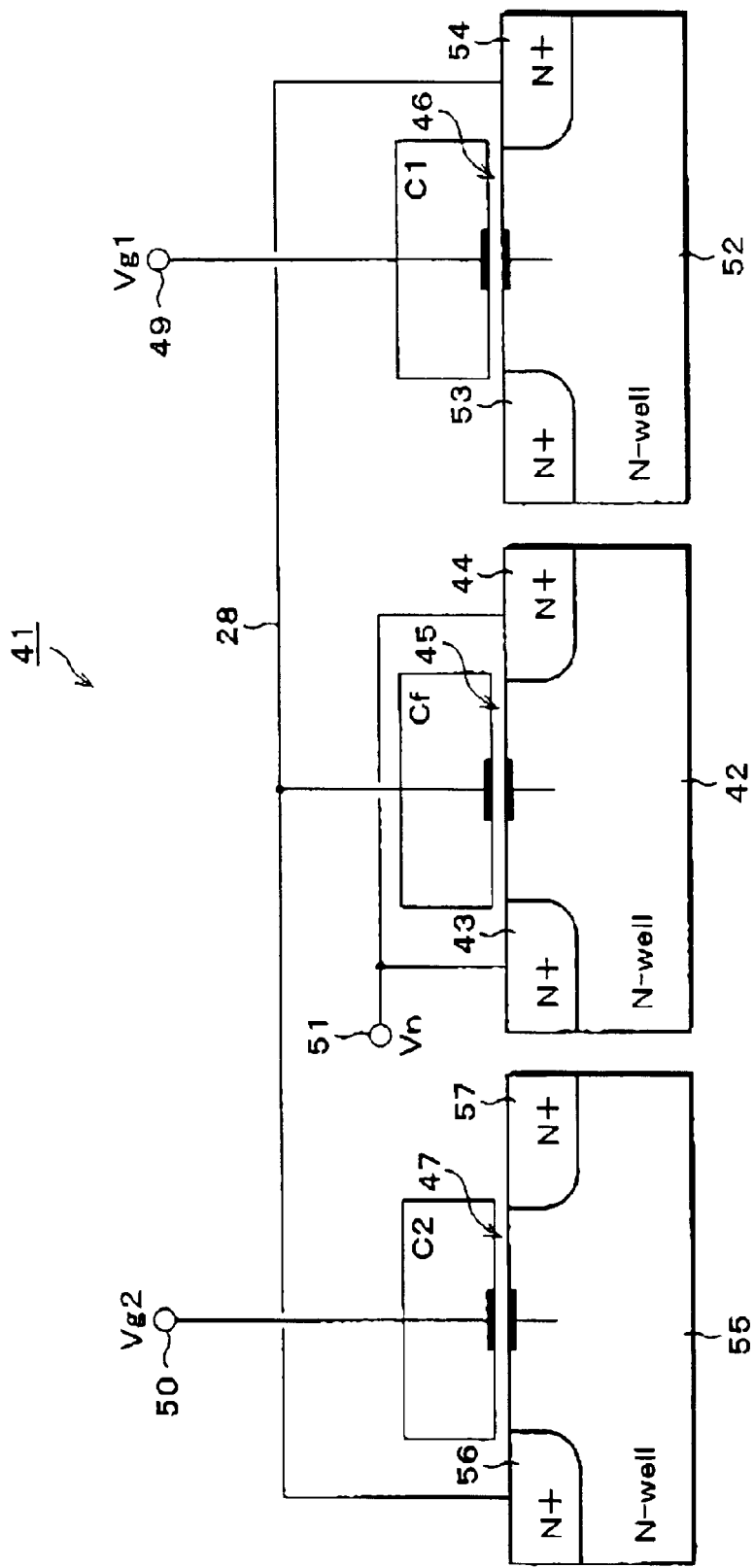
FIG. 6 is a schematic block diagram, illustrating an alternative arrangement of the multi-terminal MOS varactor fabricated by the single polysilicon CMOS process, which is illustrated in FIG. 5.

FIG. 6 is a schematic block diagram, illustrating an alternative arrangement of the multi-terminal MOS varactor fabricated by the single polysilicon CMOS process, illustrated in FIG. 5. A multi-terminal MOS varactor 41 includes: a MOS capacitor (Cf) 45; a capacitor (C1) 46; a capacitor (C2) 47; a control terminal (Vg1) 49; a control terminal (Vg2) 50; and a control terminal (Vn) 51.

The MOS capacitor (Cf) 45 is provided between an N-well 42 and a gate, and the gate, which is connected to one of two terminals of the MOS capacitor (Cf) 45, is connected to a floating electrode (Vf) 48. The other terminal of the MOS capacitor (Cf) 45 is connected to the control terminal (Vn) 51 via N+ areas 43 and 44 which are impurity areas formed on the N-well 42.

The capacitor (C1) 46 is provided between an N-well 52 and a gate, and the gate, which is connected to one of two terminals of the capacitor (C1) 46, is connected to the control terminal (Vg1) 49. The other terminal of the capacitor (C1) 45 is connected to the floating electrode (Vf) 48 via N+ areas 53 and 54 which are impurity areas formed on the N-well 52.

The capacitor (C1) 47 is provided between an N-well 55 and a gate, and the gate, which is connected to one of two terminals of the capacitor (C1) 47, is connected to the control terminal (Vg2) 50. The other terminal of the capacitor (C1) 47 is connected to the floating electrode (Vf) 48 via N+ areas 56 and 57 which are impurity areas formed on the N-well 55.

As in the multi-terminal MOS varactor 21 in FIG. 5, in the multi-terminal MOS varactor 41 in FIG. 6, laminated MOS capacitors are formed on electrically isolated N-wells on a single silicon substrate, through the single polysilicon CMOS process.

As in the foregoing description, being different from the multi-terminal MOS varactor 21 in FIG. 5, the multi-terminal MOS varactor 41 in FIG. 6 is arranged in such a manner that not only the control voltage Vg1 but also the control voltage Vg2 are supplied to the gate electrodes of the capacitors. Incidentally, this arrangement is symmetrical when the capacitor C1 is identical with the capacitor C2.

Figure 7:
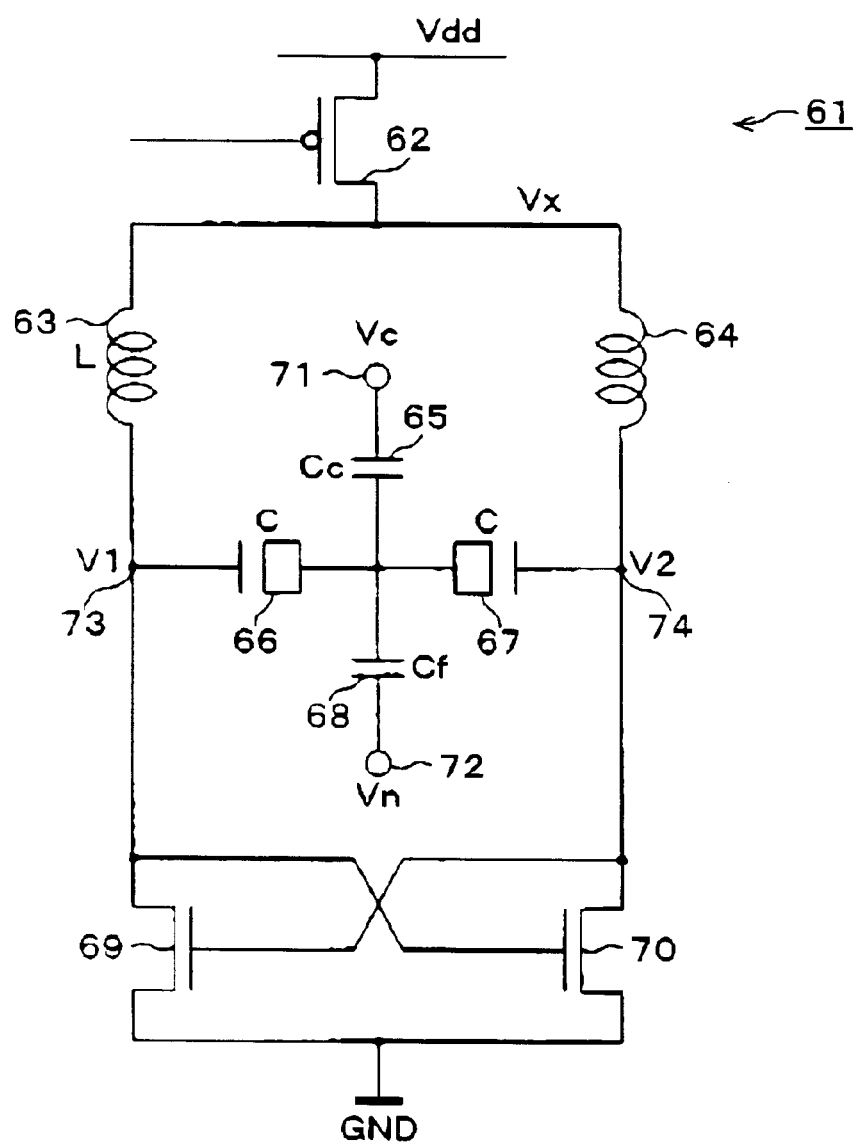
FIG. 7 is a circuit diagram, illustrating an LC VCO using a multi-terminal varactor.

Now, an arrangement that a multi-terminal MOS varactor of the present invention is adopted to a VCO is described. In the case of a VCO for RF, controllability and facility for tuning an oscillatory frequency as well as the reduction of phase noise are important and hence a multi-terminal MOS varactor which can realize these features can be adopted to an LC VCO. FIG. 7 is a circuit diagram, illustrating an LC VCO to which a multi-terminal varactor is adopted. An LC VCO 61 is provided with; a MOS transistor 62; an inductor 63; an inductor 64; a capacitor (Cc) 65, a MOS capacitor (C) 66 which is a first MOS capacitor; a MOS capacitor (C) 67 which is a second MOS capacitor; a capacitor (Cf) 68; a MOS transistor 69; and a MOS transistor 70.

A power source Vdd is connected to the MOS transistor 62, and the MOS transistor 62 is connected to one of two terminals of each of the inductors 63 and 64. The other terminal of the inductor 63 is connected to (i) one of two terminals of the MOS capacitor (C) 66, i.e. a first floating electrode, (ii) the MOS transistor 69, and (iii) a control terminal of the MOS transistor 70. The other terminal of the inductor 64 is connected to (i) one of two terminals of the MOS capacitor (C) 67, i.e. the first floating electrode, (ii) the MOS transistor 70, and (iii) a control terminal of the MOS transistor 69. The other terminal (first terminal) of the MOS capacitor (C) 66 is connected to the other terminal (first terminal) of the MOS capacitor (C) 67, and the junction of these two terminals is connected to one of two terminals of the capacitor (Cc) 65 and one of two terminals of the capacitor (Cf) 68. The other terminal of the capacitor (Cc) 65 is connected to a control terminal Vc, and the other terminal of the capacitor (Cf) 68 is connected to a control terminal (Vn) 72. Moreover, a GND is connected to the MOS transistors 69 and 70.

The capacitor (Cc) 65 and the capacitor (Cf) 68 are MIM (or DPC) capacitors with low parasitic capacity, and the capacitor (Cc) 65 receives a control voltage Vc. The MOS capacitor (C) 66 and the MOS capacitor (C) 67 are variable capacitors, realized by using MOS capacitors (MOS varactors).

Moreover, since the outputs V1 and V2 of the VCO 61 are differentials (V1=−V2), the voltage applied to the capacitor (Cf) is represented as:

$$Vf = \frac{C_c \cdot V_c + C_f \cdot V_n}{2C + C_c + C_f}$$

and this value is independent from an RF voltage (output voltage). Further, because the RF signals V1 and V2 are differentials, the effective capacitance looking from the output nodes (V1 and V2) to the C-network is just C, independent of Cc and Cf at RF.

Figure 8:
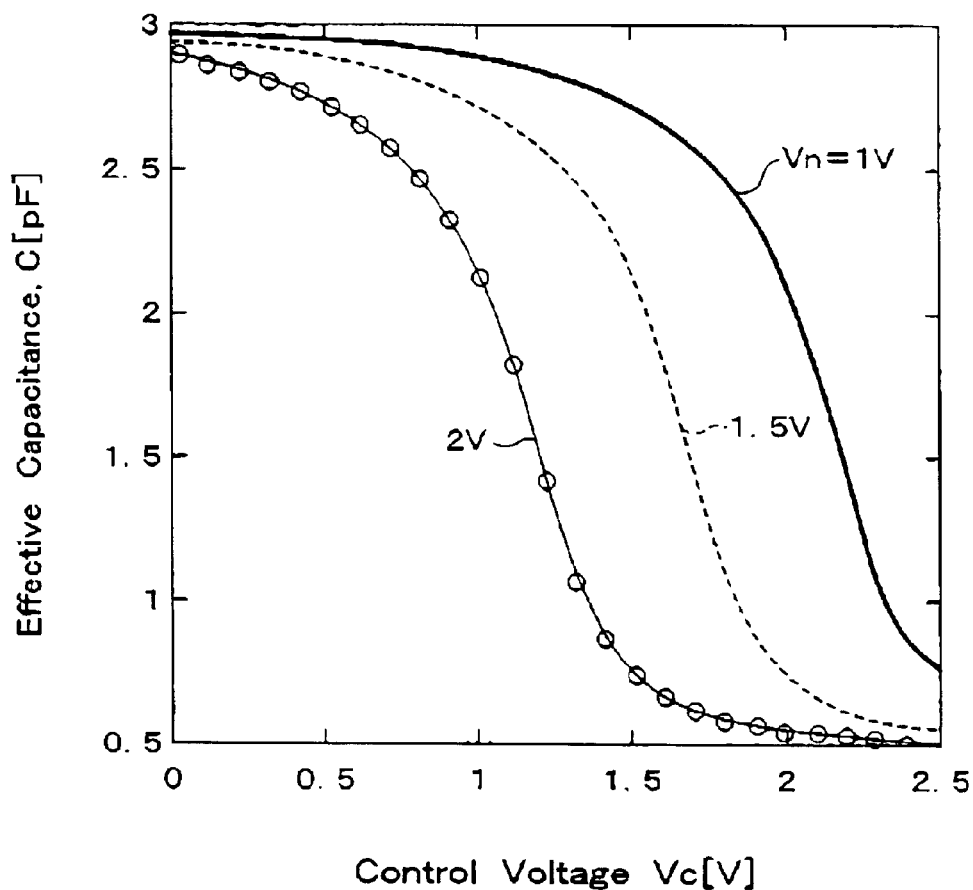
FIG. 8 is a view regarding characteristics, illustrating the relationship between an electric capacitor C and a voltage Vc in the circuit of FIG. 7.

FIG. 8 illustrates the relationship between the electrostatic capacity C and the voltage Vc in the circuit of FIG. 7. In FIG. 8, the relationship between a valid node electrostatic capacity C and the control voltage Vc of the VCO is illustrated using a voltage Vn as a parameter When the control voltage Vn is changed, a C-Vc curve moves in a lateral direction. In this arrangement, the MOS transistor 69 and the MOS transistor 70, which intersect with each other so as to be connected with each other, receive a control voltage Vx=1V. The electrostatic capacities of the respective capacitors (Cc) 65 and (Cf) 68, which are capacitors for controlling, are Cc=Cf=5pF. In the circuit of FIG., 7, sensitivity ΔC/ΔVc as well as the absolute values of the electrostatic capacities can be controlled.

Figure 9:
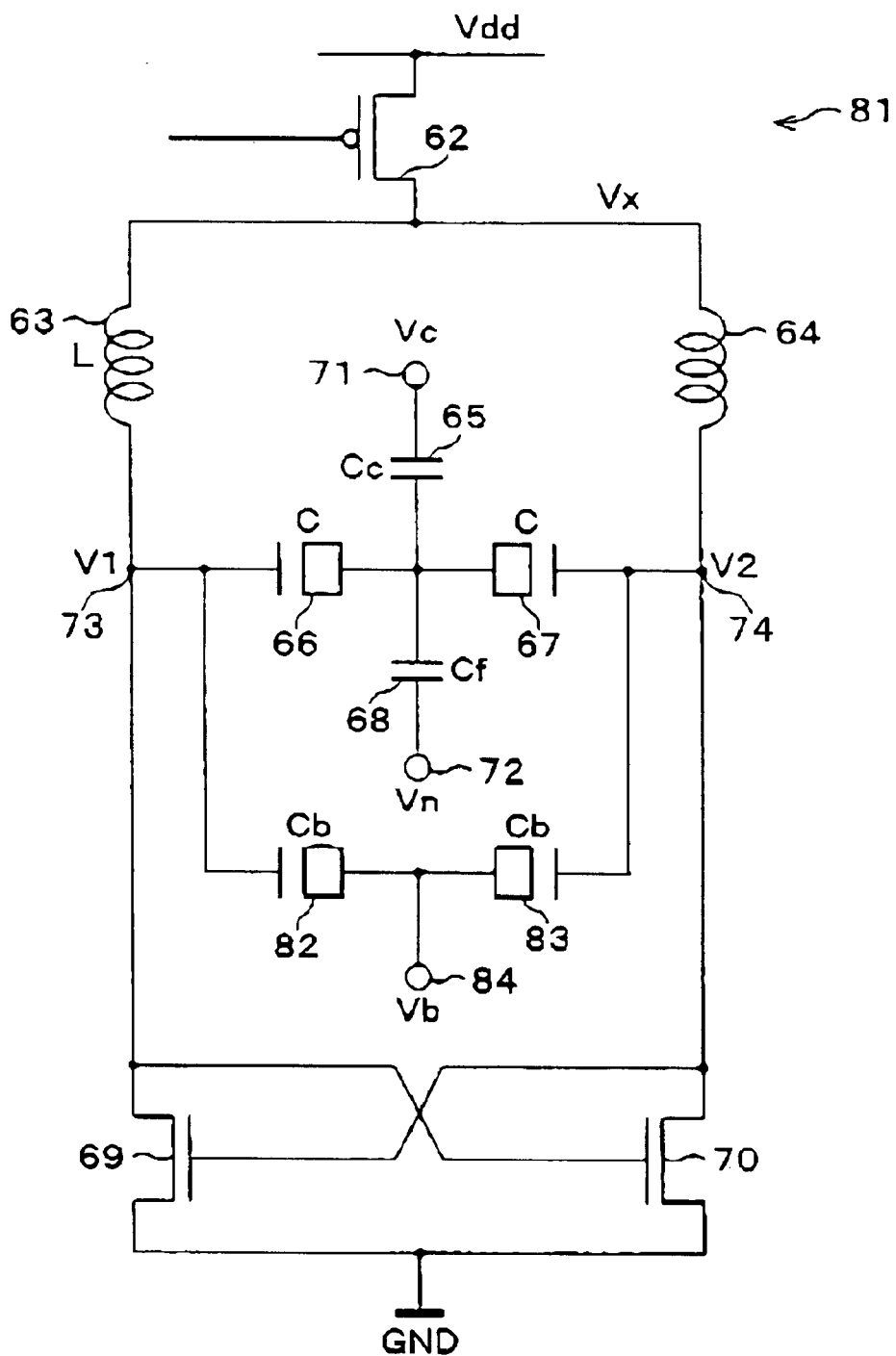
FIG. 9 is a circuit diagram, illustrating a VCO using a multi-terminal varactor, in which the gradient of a characteristic curve C-Vc can be adjusted.

FIG. 9 is a circuit diagram of a VCO to which a multi-terminal varactor is adopted and is capable of adjusting the gradient of a characteristic curve C-Vc. FIG., 10 illustrates the relationship between a valid node electrostatic capacity C and a control voltage Vc of the VCO, using a range adjustment voltage Vb as a parameter. By the way, members having the same functions as those described in FIG. 9 are given the same numbers, so that the descriptions are omitted.

An LC VCO 81 in FIG. 9 is arranged such that a MOS capacitor (Cb) 82 which is a third MOS capacitor and a MOS capacitor (Cb) 83 which is a fourth MOS capacitor are added to the LC VCO 61. That is to say, The LC VCO 81 is arranged in such a manner that a first floating electrode of the MOS capacitor (C) 66 of the LC VCO 61 is connected to one of two terminals of the MOS capacitor (Cb) 82, i.e. a second floating electrode, and a first floating electrode of the MOS capacitor (C) 67 is connected to one of two terminals of the MOS capacitor (Cb) 83, i.e. a second floating electrode. Moreover, the other terminal (second terminal) of the MOS capacitor (Cb) 83 is connected to the other terminal (second terminal) of the MOS capacitor (Cb) 84, and at the junction of these two terminals, a control terminal (Vb) 84 is connected. Moreover, adopting a MOS capacitor (varactor) to the capacitor (Cf) 68 makes it possible to electrically control the gradient of a C-V curve.

The electrostatic capacities C, Cc, and Cf and the control voltages Vc and Vn are used for adjusting the operating point of the C-V curve, i.e. the sensitivity ΔC/ΔVc. In a VCO adopting a multi-terminal varactor the following equations hold true.

$$\omega_o = \frac{1}{\sqrt{L \times [C(Vc,Vn) + C_b(Vb)]}}$$

$$\frac{d\omega_o}{dV_C} = -\frac{L}{2} \times \omega_o^3 \times \frac{dC}{dVc}$$

Figure 10:
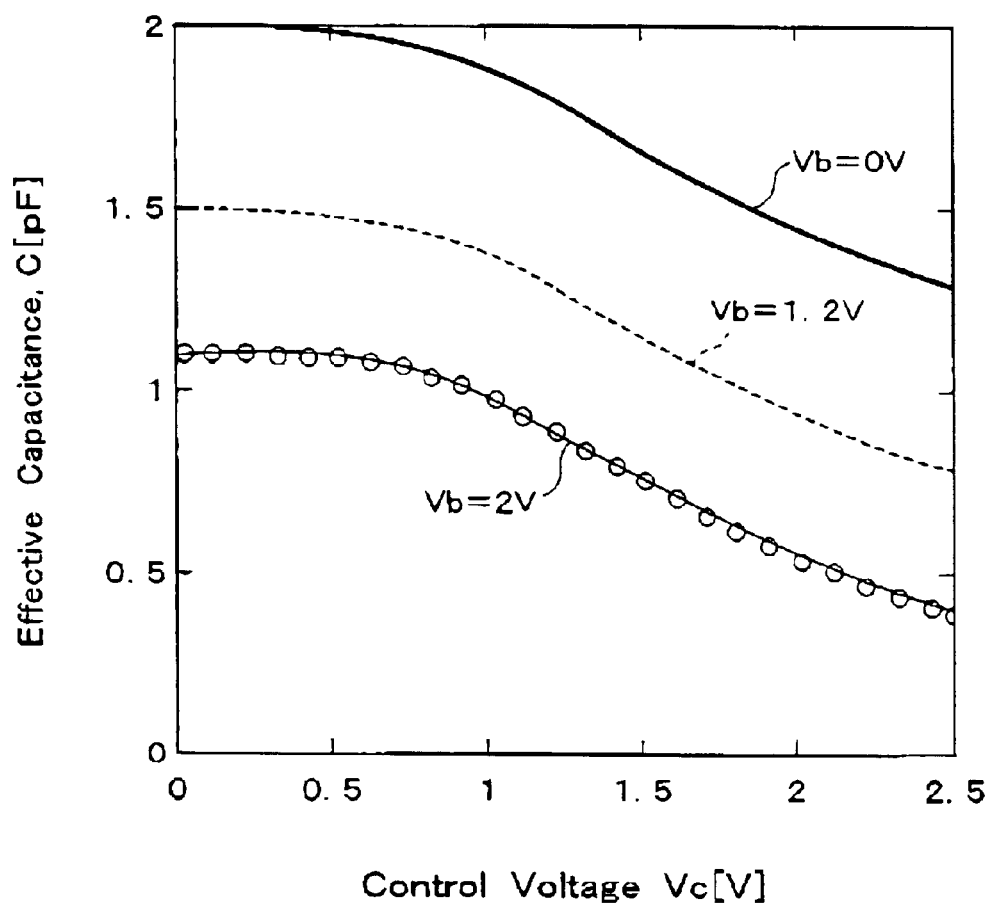
FIG. 10 is a view regarding characteristics, illustrating the relationship between a valid node electrostatic capacity C and a control voltage Vc of a VCO in which a range adjustment voltage Vb is used as a parameter.

The electrostatic capacity Cb and the control voltage Vb are used for increasing or decreasing the absolute value of the electrostatic capacity C. This arrangement is illustrated in FIG. 10. That is, as the electrostatic capacity Cb increases, the valid electrostatic capacity C decreases. Also, as the control voltage Vb increases, the valid electrostatic capacitance C decreases.

In this circuit, the MOS transistor 69 and the MOS transistor 70, which intersect with each other so as to be connected to each other, receives a control voltage Vx=1V, and the capacitor (Cc) has the electrostatic capacity Cc=3pF. Further, as the capacitor (Cf), a MOS varactor in which maximum electrostatic capacity Cfmax=10pF is adopted.

Figure 11:
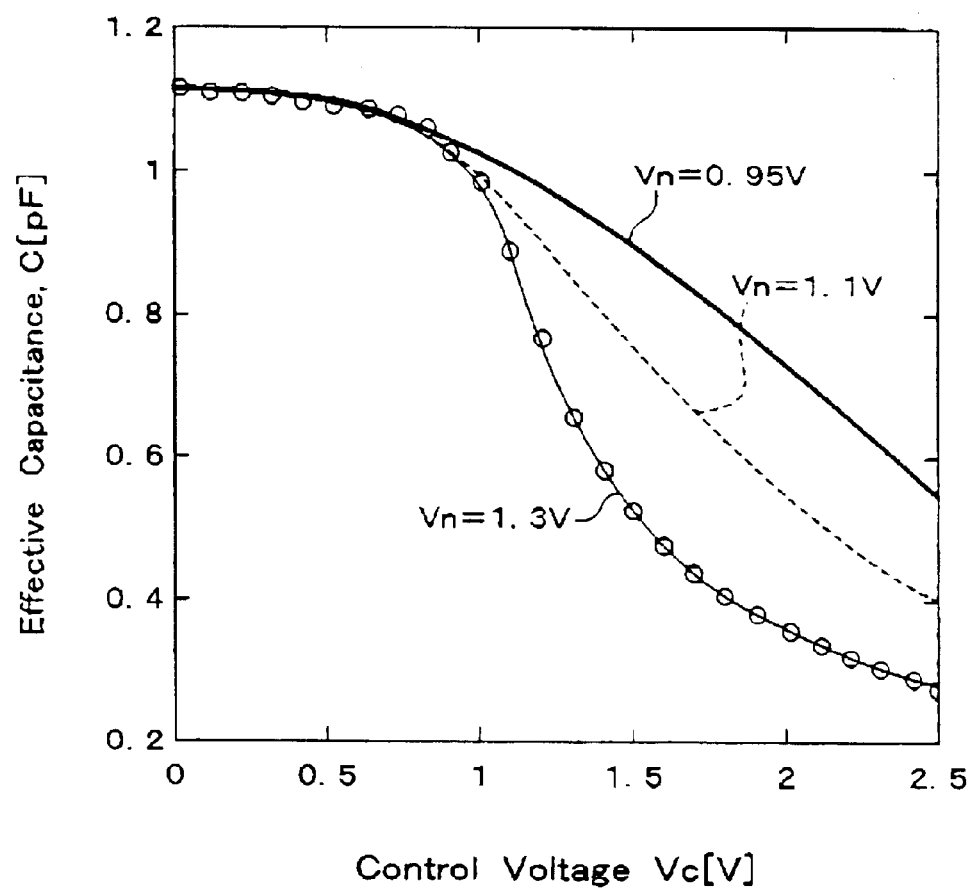
FIG. 11 is a view regarding characteristics, illustrating the relationship between a valid node electrostatic capacity C and a control voltage Vc of a VCO in which a gradient adjustment voltage Vn is used as a parameter.
Figure 12:
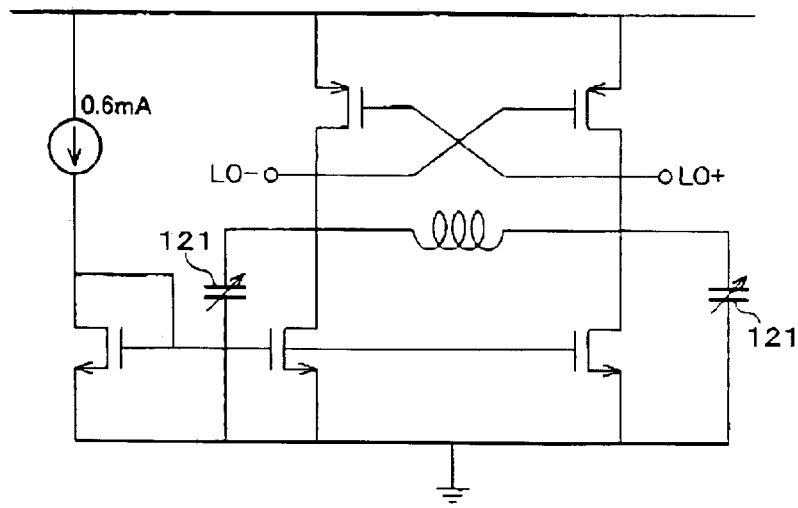
FIG. 12(a) is a circuit diagram, illustrating a conventional voltage controlled oscillator (VCO) using a MOS varactor for controlling an oscillatory frequency.
FIG. 12(b) illustrates a schematic arrangement of the MOS varactor in the VCO.
FIG. 12(c) illustrates an arrangement of a MOS capacitor to which a tuning voltage is applied in the MOS varactor.
Figure 12:
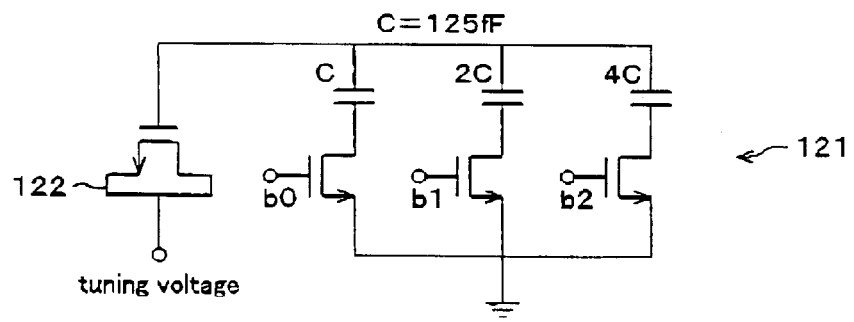
Figure 12:
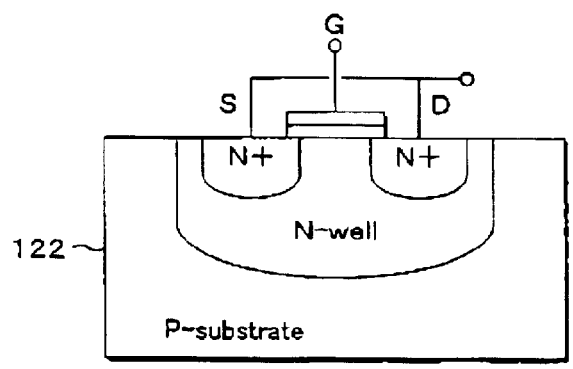
Figure 13:
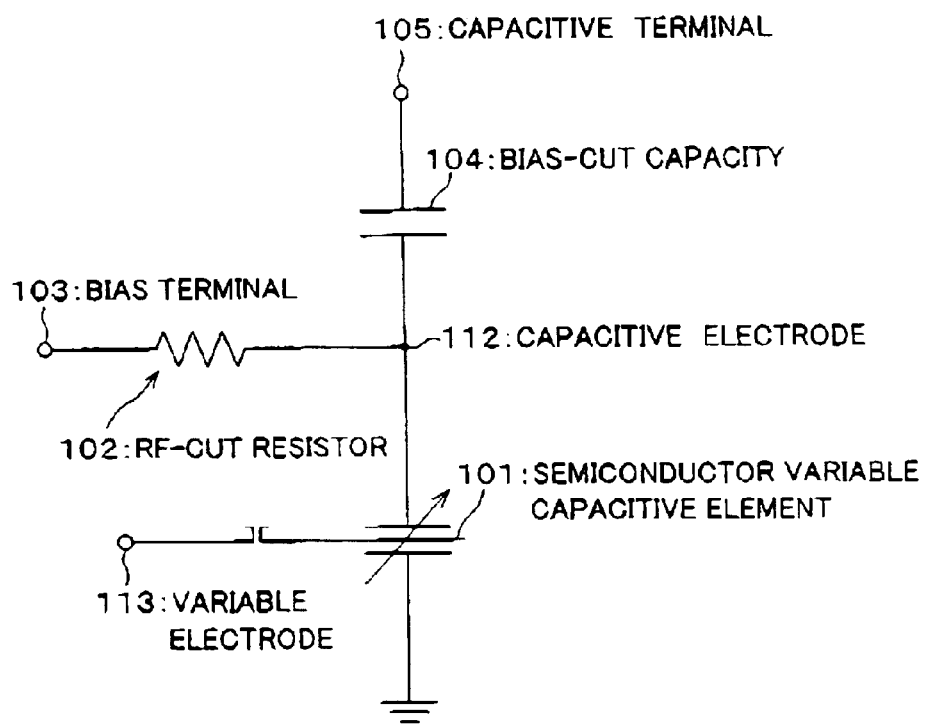
FIG. 13 is a circuit diagram, illustrating a conventional semiconductor variable capacitive element.

FIG. 11 illustrates the relationship between a valid node electrostatic capacity C and a control voltage Vc of a VCO, in which a gradient adjustment voltage Vn is used as a parameter. FIG. 11 shows that the valid sensitivity of electrostatic capacity is electrically controlled by controlling the voltage Vc. In this arrangement, a range adjustment voltage Vb is set so as to be 2V. The figure also shows examples when the gradient adjustment voltage Vn is changed to be 0.95V, 1.1V, and 1.3V. In FIG. 11, as the control voltage Vc increases, the valid electrostatic capacity C decreases. Also, as the gradient adjustment voltage Vn increases, the angle of the characteristic curve becomes steeper.

Incidentally, although the VCO illustrated in FIGS. 10 and 11 is arranged such that the capacitors Cc and Cf are connected to the junction of two capacitors C, the present invention is not limited to this arrangement. That is to say, it is possible to increase electrostatic capacity by connecting one of two terminals of each of a plurality of capacitors to the junction of two capacitors C and applying control voltages to the other terminals of the plurality of capacitors, as voltage control terminals.

Moreover, although the foregoing descriptions relate to a MOS capacitor in which an N+ area as an impurity area is formed on an N-well, the present invention is not limited to this arrangement. Thus, either an N-well or a P-well can be adopted as an well and an impurity area formed on the well can be either an N+ area or a P+ area, as long as the functions as a MOS capacitor are secured.

As in the foregoing descriptions:

(1) The multi-terminal MOS varactor in accordance with the present embodiment comprises a MOS capacitor including an impurity area formed on a well, a control terminal connected to the impurity area, and a floating electrode facing the well; and a plurality of capacitors each having two terminals, one terminal being connected to the floating electrode, and the other terminal being capable of receiving a control voltage.

According to this arrangement, the multi-terminal MOS varactor is arranged in such a manner that the floating electrode of the MOS capacitor is connected to one of two terminals of each of the plurality of capacitors, and the other terminals of the plurality of MOS capacitors can receive control voltages. Thus, when the control voltages are applied to the other terminals of the plurality of capacitors and the control voltage is applied to the control terminal, it becomes possible to progressively change the electrostatic capacity, and hence the fluctuations generated on the occasion of fabricating can be compensated. Moreover, the arrangement makes it possible to fabricate a multi-terminal MOS varactor using a typical CMOS process, without adding a supplementary step.

(2) In the foregoing multi-terminal MOS varactor, provided that the number of the plurality of capacitors is N and an electrostatic capacity of the MOS capacitor to which an electric potential Vf of the floating electrode is applied is CM(Vf), a valid electrostatic capacity of the other terminal of j-th capacitor among the plurality of capacitors is represented as:

$$C = \frac{C_j \times \left[ \sum_{k=1, k=j}^{N} C_k + C_M(Vf) \right]}{\left[ \sum_{k=1}^{N} C_k + C_M(Vf) \right]}$$

Therefore, it is possible to change the electrostatic capacity C by changing the number of the capacitors connected to the floating electrode of the MOS capacitor.

(3) Each of the plurality of capacitors has an arrangement identical with the MOS capacitor, and the MOS capacitor and the plurality of capacitors are formed on a plurality of wells which are electrically isolated with each other and provided on a single silicon substrate.

According to this arrangement, the multi-terminal MOS varactor is arranged in such a manner that the MOS capacitor and the plurality of capacitors each having an arrangement identical with the MOS capacitor are formed on the plurality of wells which are electrically isolated with each other and provided on the single silicon substrate. Thus, it is possible to fabricate a multi-terminal MOS varactor using a typical CMOS process without adding a supplementary step, and hence the manufacturing costs can be reduced.

(4) (i) A first MOS capacitor and a second MOS capacitor each having an impurity area formed on a well, a first terminal connected to the impurity area, and a first floating electrode facing the well, the first terminal of the first MOS capacitor being connected to the first terminal of the second MOS capacitor, and (ii) a plurality of capacitors each having two terminals, one terminal being connected to the first terminal of the first MOS capacitor and the first terminal of the second MOS capacitor, and the other terminal being capable of receiving a control voltage, are included.

According to this arrangement, the multi-terminal MOS varactor includes: a first MOS capacitor and a second MOS capacitor each having an impurity area formed on a well, a first terminal connected to the impurity area, and a first floating electrode facing the well, the first terminal of the first MOS capacitor being connected to the first terminal of the second MOS capacitor; and a plurality of capacitors each having two terminals, one terminal being connected to the first terminal of the first MOS capacitor and the first terminal of the second MOS capacitor, and the other terminal being capable of receiving a control voltage. Thus, adopting the multi-terminal MOS varactor to a voltage controlled oscillator enables to adjust the absolute value of electrostatic capacity and the sensitivity of electrostatic capacity including the control voltage.

(5) A third MOS capacitor and a fourth MOS capacitor, each having an impurity area formed on a well, a second terminal connected to the impurity area, and a second floating electrode faces the well, are included, and the second terminal of the third MOS capacitor is connected to the second terminal of the fourth MOS capacitor, the second floating electrode of the third MOS capacitor is connected to the first floating electrode of the first MOS capacitor, and the second floating electrode of the fourth MOS capacitor is connected to the first floating electrode of the second MOS capacitor.

According to this arrangement, the multi-terminal MOS varactor as defined in (4) further includes the third and fourth MOS capacitors having the respective second terminals which are connected to the impurity areas formed on the respective wells and connected to each other, and the second floating electrode of the third MOS capacitor is connected to the first floating electrode of the first MOS capacitor, while the second floating electrode of the fourth MOS capacitor is connected to the first floating electrode of the second MOS capacitor. Thus, adopting this multi-terminal MOS varactor to a voltage controlled oscillator enables to realize a voltage controlled oscillator with a wide adjustable range, in which the absolute value of electrostatic capacity and the sensitivity of electrostatic capacity including the control voltage can be adjusted and the gradient of a C-V curve can be controlled.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A multi-terminal MOS varactor, comprising:
   a MOS capacitor including an impurity area formed on a well, a control terminal connected to the impurity area, and a floating electrode facing the well;
   a plurality of capacitors each having first and second terminals, the first terminal of each being electrically connected to the floating electrode, and the second terminal of each being capable of receiving a control voltage; and
   means for supplying the second terminal of at least one of the plurality of capacitors with at least one control voltage so that the at least one control voltage supplied to the second terminal(s) of the capacitor(s) can be varied in a manner so as to progressively and continuously change a value of electrostatic capacity of the varactor.

2. A multi-terminal MOS varactor, comprising:
   a MOS capacitor including an impurity area formed on a well, a control terminal connected to the impurity area, and a floating electrode facing the well;
   a plurality of capacitors each having two terminals, one terminal of each being connected to the floating electrode, and the other terminal of each being capable of receiving a control voltage; and
   wherein each of the plurality of capacitors has an arrangement identical with the MOS capacitor, and the MOS capacitor and the plurality of capacitors are formed on a plurality of wells which are electrically isolated from each other and provided on a single silicon substrate.

3. The multi-terminal MOS varactor as defined in claim 1, wherein, provided that a number of the plurality of capacitors is N and an electrostatic capacity of the MOS capacitor to which an electric potential Vf of the floating electrode is applied is CM(Vf), a valid electrostatic capacity of the other terminal of j-th capacitor among the plurality of capacitors is represented as:

$$C = \frac{C_j \times \left[\sum_{k=1, k \neq j}^{N} C_k + C_M(Vf)\right]}{\left[\sum_{k=1}^{N} C_k + C_M(Vf)\right]}.$$

4. The multi-terminal MOS varactor as defined in claim 3, wherein each of the plurality of capacitors has an arrangement identical with the MOS capacitor, and the MOS capacitor and the plurality of capacitors are formed on a plurality of wells which are electrically isolated from each other and provided on a single silicon substrate.

5. A multi-terminal MOS varactor, comprising:
   a first MOS capacitor and a second MOS capacitor each having an impurity area formed on a well, a first terminal connected to the impurity area, and a first floating electrode facing the well, the first terminal of the first MOS capacitor being connected to the first terminal of the second MOS capacitor; and
   a plurality of capacitors each having two terminals, one terminal being connected to the first terminal of the first MOS capacitor and the first terminal of the second MOS capacitor, and the other terminal being capable of receiving a control voltage.

6. The multi-terminal MOS varactor as defined in claim 5, further comprising a third MOS capacitor and a fourth MOS capacitor each having an impurity area formed on a well, a second terminal connected to the impurity area, and a second floating electrode facing the well, the second terminal of the third MOS capacitor being connected to the second terminal of the fourth MOS capacitor,
   wherein, the second floating electrode of the third MOS capacitor is connected to the first floating electrode of the first MOS capacitor, and the second floating electrode of the fourth MOS capacitor is connected to the first floating electrode of the second MOS capacitor.

7. A voltage controlled oscillator, comprising a variable capacitive element for changing oscillatory frequency, wherein, the variable capacitive element is a multi-terminal MOS varactor including:
   a MOS capacitor including an impurity area formed on a well, a control terminal connected to the impurity area, and a floating electrode facing the well;
   a plurality of capacitors each having two terminals, one terminal being connected to the floating electrode, and the other terminal being capable of receiving a control voltage; and
   means for supplying the other terminal of at least one of the plurality of capacitors with at least one variable control voltage so that the at least one control voltage supplied to the other terminal(s) of the capacitor(s) can be varied in a manner so as to progressively change a value of electrostatic capacity of the varactor.

8. A voltage controlled oscillator, comprising a variable capacitive element for changing oscillatory frequency, wherein, the variable capacitive element is a multi-terminal MOS varactor including:
   a MOS capacitor including an impurity area formed on a well, a control terminal connected to the impurity area, and a floating electrode facing the well;
   a plurality of capacitors each having two terminals, one terminal being connected to the floating electrode, and the other terminal being capable of receiving a control voltage; and
   wherein each of the plurality of capacitors has an arrangement identical with the MOS capacitor, and the MOS capacitor and the plurality of capacitors are formed on a plurality of wells which are electrically isolated from each other and provided on a single silicon substrate.

9. The voltage controlled oscillator as defined in claim 7, wherein, provided that a number of the plurality of capacitors is N and an electrostatic capacity of the MOS capacitor to which an electric potential Vf of the floating electrode is applied is CM(Vf), a valid electrostatic capacity of the other terminal of j-th capacitor among the plurality of capacitors is represented as:

$$C = \frac{C_j \times \left[\sum_{k=1, k \neq j}^{N} C_k + C_M(Vf)\right]}{\left[\sum_{k=1}^{N} C_k + C_M(Vf)\right]}.$$

10. The voltage controlled oscillator as defined in claim 9, wherein each of the plurality of capacitors has an arrangement identical with the MOS capacitor, and the MOS capacitor and the plurality of capacitors are formed on a plurality of wells which are electrically isolated from each other and provided on a single silicon substrate.

11. A voltage controlled oscillator, comprising
a variable capacitive element for changing an oscillatory frequency, wherein, the variable capacitive element includes:
a first MOS capacitor and a second MOS capacitor each having an impurity area formed on a well, a first terminal connected to the impurity area, and a first floating electrode facing the well, the first terminal of the first MOS capacitor being connected to the first terminal of the second MOS capacitor; and
a plurality of capacitors each having two terminals, one terminal being connected to the first terminal of the first MOS capacitor and the first terminal of the second MOS capacitor, and the other terminal being capable of receiving a control voltage.

12. The voltage controlled oscillator as defined in claim 11, further comprising a third MOS capacitor and a fourth MOS capacitor each having an impurity area formed on a well, a second terminal connected to the impurity area, and a second floating electrode facing the well, the second terminal of the third MOS capacitor being connected to the second terminal of the fourth MOS capacitor,
wherein, the second floating electrode of the third MOS capacitor is connected to the first floating electrode of the first MOS capacitor, and the second floating electrode of the fourth MOS capacitor is connected to the first floating electrode of the second MOS capacitor.

13. A method of varying a value of electrostatic capacity of a multi-terminal MOS varactor, the method comprising:
providing a MOS capacitor including an impurity area formed on a well, a control terminal connected to the impurity area, and a floating electrode facing the well;
providing a plurality of capacitors each having first and second terminals, the first terminal of each being electrically connected to the floating electrode, and the second terminal of each being capable of receiving a control voltage; and
supplying the second terminal of at least one of the plurality of capacitors with at least one variable control voltage so that the at least one control voltage supplied to the second terminal(s) of the capacitor(s) is varied in a manner so as to progressively change a value of electrostatic capacity of the varactor.

* * * * *